(12) United States Patent
Franke et al.

(10) Patent No.: US 11,150,690 B2
(45) Date of Patent: Oct. 19, 2021

(54) MOVABLE MOUNTING ASSEMBLIES

(71) Applicant: HEWLETT-PACKARD DEVELOPMENT COMPANY, L.P., Houston, TX (US)

(72) Inventors: Gregory C. Franke, Houston, TX (US); Chih Chien Chen, Taipei (CN); Ming-Shan Tsai, Taipei (CN)

(73) Assignee: Hewlett-Packard Development Company, L.P., Spring, TX (US)

( * ) Notice: Subject to any disclaimer, the term of this patent is extended or adjusted under 35 U.S.C. 154(b) by 642 days.

(21) Appl. No.: 16/076,155

(22) PCT Filed: Jul. 6, 2017

(86) PCT No.: PCT/US2017/040948
§ 371 (c)(1),
(2) Date: Aug. 7, 2018

(87) PCT Pub. No.: WO2019/009909
PCT Pub. Date: Jan. 10, 2019

(65) Prior Publication Data
US 2021/0200266 A1 Jul. 1, 2021

(51) Int. Cl.
*G06F 1/16* (2006.01)
*H05K 5/02* (2006.01)
*H05K 5/00* (2006.01)

(52) U.S. Cl.
CPC ......... *G06F 1/1607* (2013.01); *H05K 5/0017* (2013.01); *H05K 5/0221* (2013.01); *H05K 5/0234* (2013.01); *G06F 1/1633* (2013.01)

(58) Field of Classification Search
CPC ... G06F 1/1607; G06F 1/1633; H05K 5/0234; H05K 5/0221; H05K 5/0017; H04N 5/2252; H04N 7/142
See application file for complete search history.

(56) References Cited

U.S. PATENT DOCUMENTS 5,801,919 A 9/1998 Griencewic
7,126,816 B2 * 10/2006 Krah .................. G06F 1/1616
361/679.55

(Continued)

FOREIGN PATENT DOCUMENTS

CN 2870332 2/2007
CN 2870332 Y 2/2007

(Continued)

OTHER PUBLICATIONS

"Philips 241B7QPJKEB 24" IPS Height Adjust Webcam Full HD LED Monitor, MISCO, Retrieved from internet—http://www.misco.co.uk/product/2673102/Philips-241B7QPJKEB-24inch-IPS-Height-Adjust-Webcam-Full-HD-LED-Monitor, 2017, 4 Pages.

*Primary Examiner* — Hung S. Bui
*Assistant Examiner* — Sagar Shrestha
(74) *Attorney, Agent, or Firm* — Conley Rose PC

(57) ABSTRACT

An example electronic device includes an outer housing, a shoulder connected to the outer housing, and a mounting assembly moveably coupled to the outer housing to mount a peripheral module. The mounting assembly has a rotatable arm biased to a first angular position. The rotatable arm is to remain in the first angular position when a first peripheral module is mounted, whereby the mounting assembly is moveable to extend the first peripheral module to a first clearance distance. The rotatable arm is rotatable to a second angular position in response to mounting a second peripheral module, whereby the mounting assembly is moveable to engage the rotatable arm against the first shoulder and to extend the second peripheral module to a second clearance distance that is less than the first distance.

15 Claims, 9 Drawing Sheets

(56) References Cited

U.S. PATENT DOCUMENTS

| | | | | |
|---|---|---|---|---|
| 7,570,485 | B2* | 8/2009 | Krah | G06F 1/1616 |
| | | | | 345/157 |
| 10,659,667 | B1* | 5/2020 | Qiu | G03B 17/04 |
| 10,812,698 | B1* | 10/2020 | Zhou | G03B 17/561 |
| 10,841,408 | B2* | 11/2020 | Wang | G06F 1/1686 |
| 10,880,420 | B2* | 12/2020 | Yang | H04N 5/2257 |
| 10,924,643 | B2* | 2/2021 | Xu | H04M 1/0264 |
| 10,999,518 | B1* | 5/2021 | Lavallo | H04N 5/23299 |
| 2005/0014527 | A1* | 1/2005 | Chambers | H04N 5/2256 |
| | | | | 455/556.1 |
| 2006/0261257 | A1* | 11/2006 | Hwang | H04N 5/2259 |
| | | | | 250/216 |
| 2008/0064437 | A1* | 3/2008 | Chambers | H04N 1/00307 |
| | | | | 455/556.1 |
| 2013/0279106 | A1 | 10/2013 | Ergun et al. | |
| 2014/0009628 | A1 | 1/2014 | Jang et al. | |
| 2016/0191760 | A1* | 6/2016 | Wu | H04N 5/2251 |
| | | | | 348/262 |
| 2016/0205293 | A1* | 7/2016 | Jung | H04N 5/2252 |
| | | | | 348/373 |
| 2017/0064166 | A1* | 3/2017 | Xiong | H04M 1/0264 |
| 2018/0262663 | A1* | 9/2018 | Zhang | H04M 1/0264 |
| 2019/0138062 | A1* | 5/2019 | Zeng | H04M 1/0264 |
| 2020/0064882 | A1* | 2/2020 | Chiu | G06F 1/1656 |
| 2020/0177716 | A1* | 6/2020 | Chen | F16M 11/08 |

FOREIGN PATENT DOCUMENTS

| | | |
|---|---|---|
| CN | 202694217 U | 1/2013 |
| CN | 103533406 | 1/2014 |
| CN | 206042064 | 3/2017 |
| JP | H11313233 A | 11/1999 |

* cited by examiner

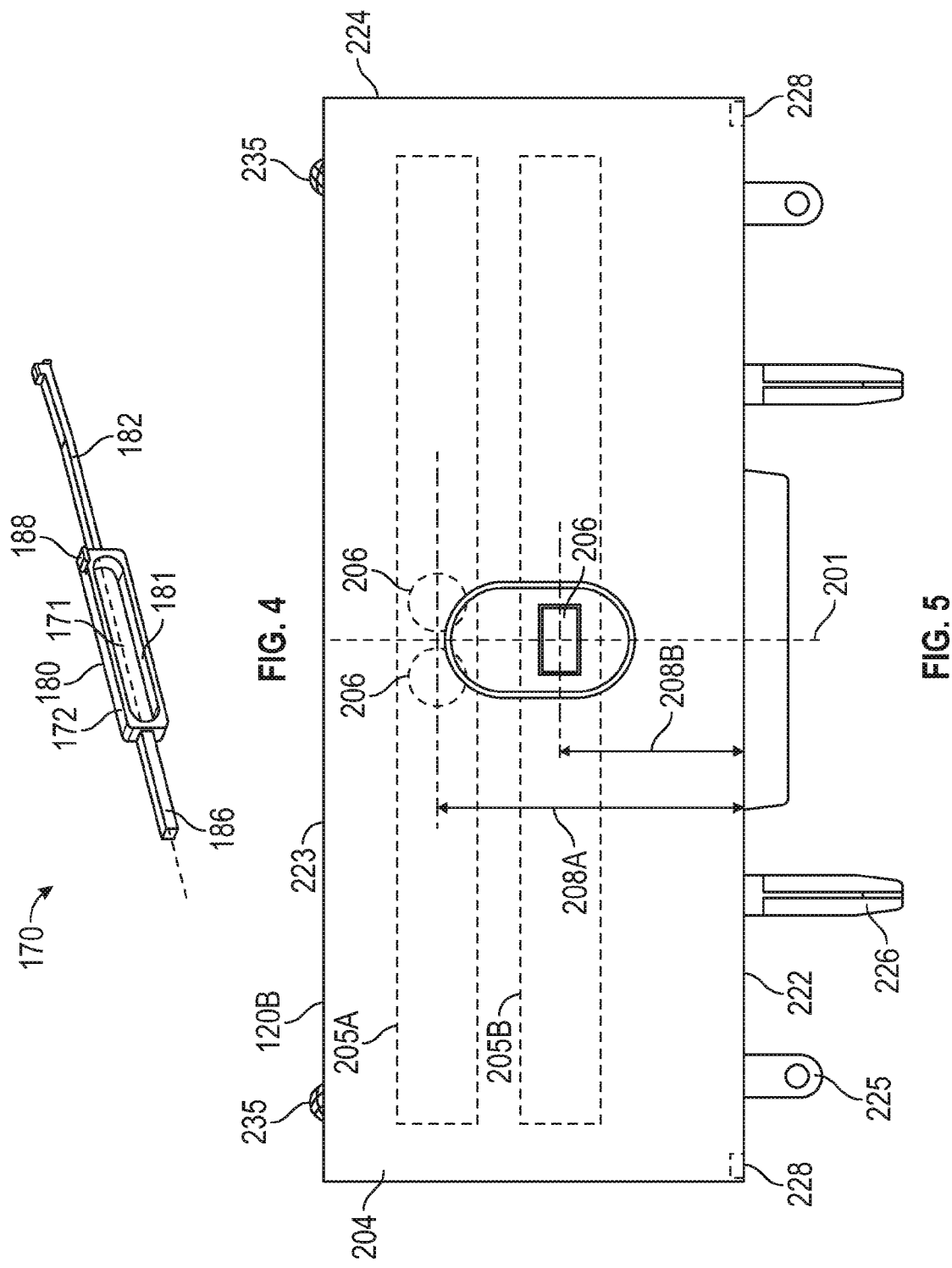

MOVABLE MOUNTING ASSEMBLIES

BACKGROUND

Various electronic devices, such as some stand-alone monitors, portable computers, desktop computers, and all-in-one (AiO) desktop computers, include cameras or other sensing elements incorporated into the body of the device. Some cameras are configured to move relative to a housing in which they are installed. Additional movement options may be beneficial.

BRIEF DESCRIPTION OF THE DRAWINGS

Various examples will be described below referring to the following figures:

FIG. 4 shows the latch mechanism of the camera mounting apparatus of FIG. 3 in accordance with various examples;

FIG. 5 shows a rear view of a camera module for removably attaching to the camera mounting apparatus of FIG. 3 in accordance with various examples;

DETAILED DESCRIPTION

Figure 1:
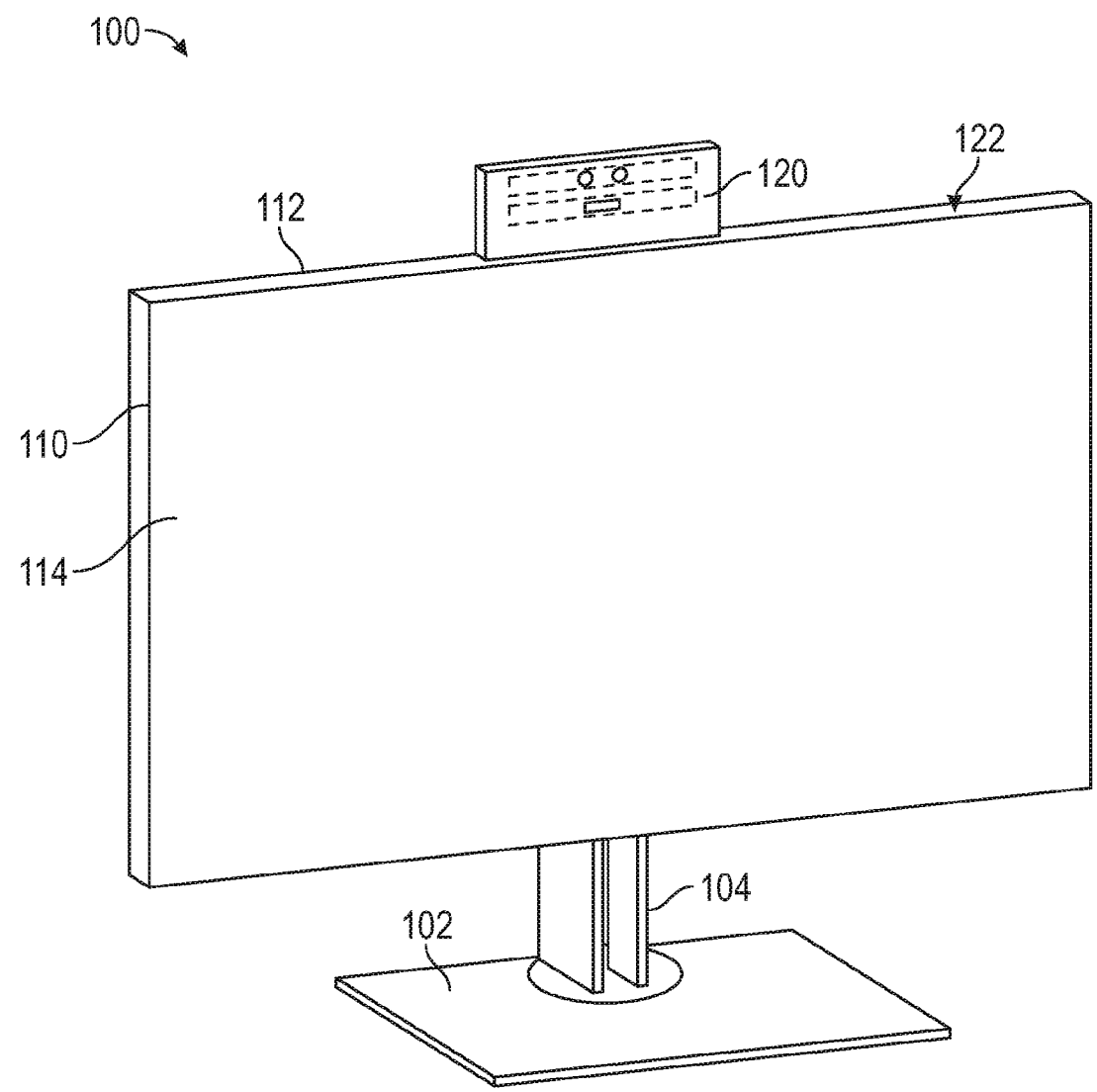
FIG. 1 shows an electronic device having a retractable, removable peripheral module installed in accordance with various examples.

In the following discussion and in the claims, the terms "including" and "comprising" are used in an open-ended fashion, and thus should be interpreted to mean "including, but not limited to . . . ." Also, the term "couple" or "couples" is intended to be broad enough to encompass both indirect and direct connections. Thus, if a first device couples to a second device, that connection may be through a direct connection or through an indirect connection via other devices, components, and connections. In addition, as used herein, the terms "axial" and "axially" generally refer to positions along or parallel to a central or longitudinal axis (e.g., central axis of a body or a port), while the terms "lateral" and "laterally" generally refer to positions located or spaced to the side of the central or longitudinal axis.

As used herein, including in the claims, the word "or" is used in an inclusive manner. For example, "A or B" means any of the following: "A" alone, "B" alone, or both "A" and "B." In addition, when used herein including the claims, the word "generally" or "substantially" means within a range of plus or minus 20%.

Examples described herein are directed to apparatuses for mounting peripheral modules to electronic devices such as All-in-One (AiO) computers or stand-alone monitors. The electronic device may include a display screen. In accordance with various examples, the electronic devices disclosed herein include an outer housing, a display screen supported within the outer housing, and a recess in the outer housing that receives a moveable peripheral module containing a camera. A mounting assembly moveably couples the peripheral module to the outer housing and allows the peripheral module to move linearly into and out of the recess between a retracted position and an extended position. The mounting assembly also includes a stop tab or rotatable arm biased to a first angular position, which may be tapered with respect to the direction of linear movement, as an example.

In an embodiment, a first peripheral module includes a camera body, a camera sensor, and a pair of mounting pins extending from the bottom of the camera body. Some versions of this embodiment include a plurality of camera sensors, and some of the camera sensors may face in different directions. The first peripheral module may be optionally coupled to the mounting assembly to move with it, with the pair of mounting pins extending into the mounting assembly. The first peripheral module does not engage the rotatable arm, which remains in a first angular position.

In an embodiment, a second peripheral module includes a camera body, a camera sensor, a first pair of mounting pins, and a second pair of mounting pins, both pairs of mounting pins extending from the bottom of the camera body. The second peripheral module may be optionally coupled to the mounting assembly with both pairs of mounting pins extending into the mounting assembly and with the second pair of mounting pins engaging the rotatable arm, causing it to rotate to a second angular position, which may be horizontal, for example.

With either peripheral module coupled to the mounting assembly, the mounting assembly and the peripheral module may together be selectively raised or lowered in a linear direction such that at least a portion of the peripheral module, including the camera sensor, either extends a distance beyond the device body or is located within the recess. When extended, the maximum distance between the camera sensor and the device body depends on the angular position of the rotatable arm. For example, with the first peripheral module installed, the rotatable arm remains in the first position, and the mounting assembly and peripheral module may be raised such that the camera sensor may be positioned away from the device body at a first distance, which is a maximum for this configuration. With the second peripheral module installed, the rotatable arm is in the second position and eventually engages a shoulder within the device body as the mounting assembly is raised. This engagement limits the movement of the mounting assembly, such that the camera sensor may be positioned away from the device body at a second distance, and the second distance is less than the first distance. Optionally, the first and second distances may be referenced to another location or feature on the peripheral module, a location different than the camera sensor.

In some examples, an electronic device includes an outer housing, a mounting assembly moveably coupled to the outer housing to mount a peripheral module, the mounting assembly including a rotatable arm biased to a first angular position, and a first shoulder disposed within the outer housing, wherein the rotatable arm is to remain in the first angular position when a first peripheral module is mounted, whereby the mounting assembly is moveable to extend the first peripheral module to a first clearance distance, and wherein the rotatable arm is rotatable to a second angular position in response to mounting a second peripheral module, whereby the mounting assembly is moveable to engage the rotatable arm against the first shoulder and to extend the second peripheral module to a second clearance distance less than the first distance. The electronic device of claim 1 may include a display screen supported by the outer housing. The mounting assembly may include a body slidably coupled to the outer housing to move along a body axis with the peripheral module, wherein the body includes a first side and an aperture extending parallel to the body axis and through the first side, wherein the rotatable arm is an elongate member and includes a rotational axis perpendicular to the elongate member, and wherein a contact location on the rotatable arm is aligned with the aperture for a probe on the second peripheral module to extend through the aperture, to push against the contact location, and to rotate the rotatable arm to the second angular position.

In some examples, the body of the mounting assembly comprises an elongate slot extending parallel to the body axis, and a pin coupled to the outer housing extends through the slot. The rotational axis may be perpendicular to the body axis. The mounting assembly may include a latch mechanism to attach the mounting assembly to the first or second peripheral module, the latch mechanism including a slotted portion, an arm coupled to an end of the slotted portion to grasp the first or second peripheral module, and a boss extending parallel to the rotational axis, wherein the slotted portion includes an elongate slot oriented parallel to the body axis, and wherein a pin extends from the body of the mounting assembly into the slot of the slotted portion. The body of the mounting assembly may include a body shoulder extending toward the body axis, wherein the rotatable arm does not extend between the boss and the body shoulder when the rotatable arm is at the first angular position, and wherein the rotatable arm extends between the boss and the body shoulder when the rotatable arm is at the second angular position.

In some examples, an electronic device includes an outer housing, a mounting assembly moveably coupled to the outer housing to move a peripheral module into and out of the outer housing, the mounting assembly including a rotatable arm biased to a first angular position, and a first shoulder disposed within the outer housing, wherein the rotatable arm is to remain in the first angular position when a first peripheral module is mounted to the mounting assembly, whereby the mounting assembly is moveable to dispose a distal end of the first peripheral module to a first clearance distance beyond the outer housing, wherein the rotatable arm is rotatable to a second angular position in response to mounting a second peripheral module to the mounting assembly, whereby the mounting assembly is moveable to engage the rotatable arm against the first shoulder and to dispose a distal end of the second peripheral module to a second clearance distance beyond the outer housing, and wherein the second clearance distance is less than the first clearance distance. The mounting assembly includes a body slidably coupled to the outer housing to move along a body axis with the peripheral module, wherein the body includes a first side and an aperture extending parallel to the body axis and through the first side, wherein the rotatable arm is an elongate member and includes a rotational axis perpendicular to the elongate member, and wherein a contact location on the rotatable arm is aligned with the aperture for a probe on the second peripheral module to extend through the aperture, to push against the contact location, and to rotate the rotatable arm to the second angular position.

In some examples, the mounting assembly may include a body slidably coupled to the outer housing to move along a body axis, wherein the body of the mounting assembly includes a body shoulder extending toward the body axis, wherein the rotatable arm does not extend alongside the body shoulder when the rotatable arm is at the first angular position, and wherein the rotatable arm extends alongside the body shoulder when the rotatable arm is at the second angular position.

In some examples, an electronic device includes an outer housing including a recess to receive a peripheral module, a display screen supported by the outer housing, a mounting assembly moveably coupled to the outer housing to move the peripheral module into and out of the recess, the mounting assembly including a rotatable arm biased to a first angular position, and a first shoulder disposed at a fixed position within the outer housing, wherein the rotatable arm remains in the first angular position when a first peripheral module is mounted to the mounting assembly, whereby the mounting assembly is moveable to a first position to extend the first peripheral module beyond the recess of the outer housing, and wherein the rotatable arm is rotatable to a second angular position in response to mounting a second peripheral module to the mounting assembly, whereby the mounting assembly is moveable to a second position to engage the rotatable arm against the first shoulder and to extend the second peripheral module beyond the recess of the outer housing. The mounting assembly may include a body slidably coupled to the outer housing to move along a body axis, wherein the body includes a first side, wherein the first peripheral module includes a mounting end to be disposed alongside the first side of the body and a distal end to be separated from the first side of the body, and wherein when the first peripheral module is mounted to the mounting assembly, and the mounting assembly is disposed at the first position, the distal end of the first peripheral module is disposed at a first clearance distance beyond the recess of the outer housing. The second peripheral module may include a mounting end to be disposed alongside the first side of the body and a distal end to be separated from the first side of the body, wherein when the second peripheral module is mounted to the mounting assembly, and the mounting assembly is disposed at the second position, the distal end of the second peripheral module is disposed at a second clearance distance beyond the recess of the outer housing, and wherein the second clearance distance is less than the first clearance distance.

In some examples, the first peripheral module may include a mounting end to be disposed alongside the first side of the body, a first camera disposed at a first camera distance from the mounting end, and a second camera disposed at a second camera distance from the mounting end, wherein the second camera distance is less than the first camera distance, and wherein when the first peripheral module is mounted to the mounting assembly and the mounting assembly disposed at the first position, the first camera is disposed at a first clearance distance beyond the recess of the outer housing. The second peripheral module may include a mounting end to be disposed alongside the first side of the body and a camera disposed at a third camera distance from the mounting end, wherein the third camera distance is equal to or greater than the first camera distance, wherein when the second peripheral module is mounted to the mounting assembly, and the mounting assembly is disposed at the second position, the camera of the second peripheral module is disposed at a second clearance distance beyond the recess of the outer housing, and wherein the second clearance distance is less than the first clearance distance.

FIG. 1 shows an electronic device 100 in accordance with the principles disclosed herein. In this example, electronic device 100 includes a support base 102, a mounting arm 104 extending from base 102, and a display unit 110 supported on the upper end of arm 104. Display unit 110 includes an outer housing 112 and a display screen 114 supported within housing 112. A peripheral module is moveably coupled to housing 112. In this example, the peripheral module is a camera module 120, and camera module 120 can move vertically up and down relative to housing 112, and extend from the top surface 122 of housing 112. The camera module 120 may also be coupled to other sides or surfaces of housing 112. In the example shown in FIG. 1, electronic device 100 is an AiO computer. A user input device, such as keyboard or mouse, may be coupled to device 100. In some embodiments, display unit 110 may operate alone, detached from base 102 or arm 104.

Figure 2:
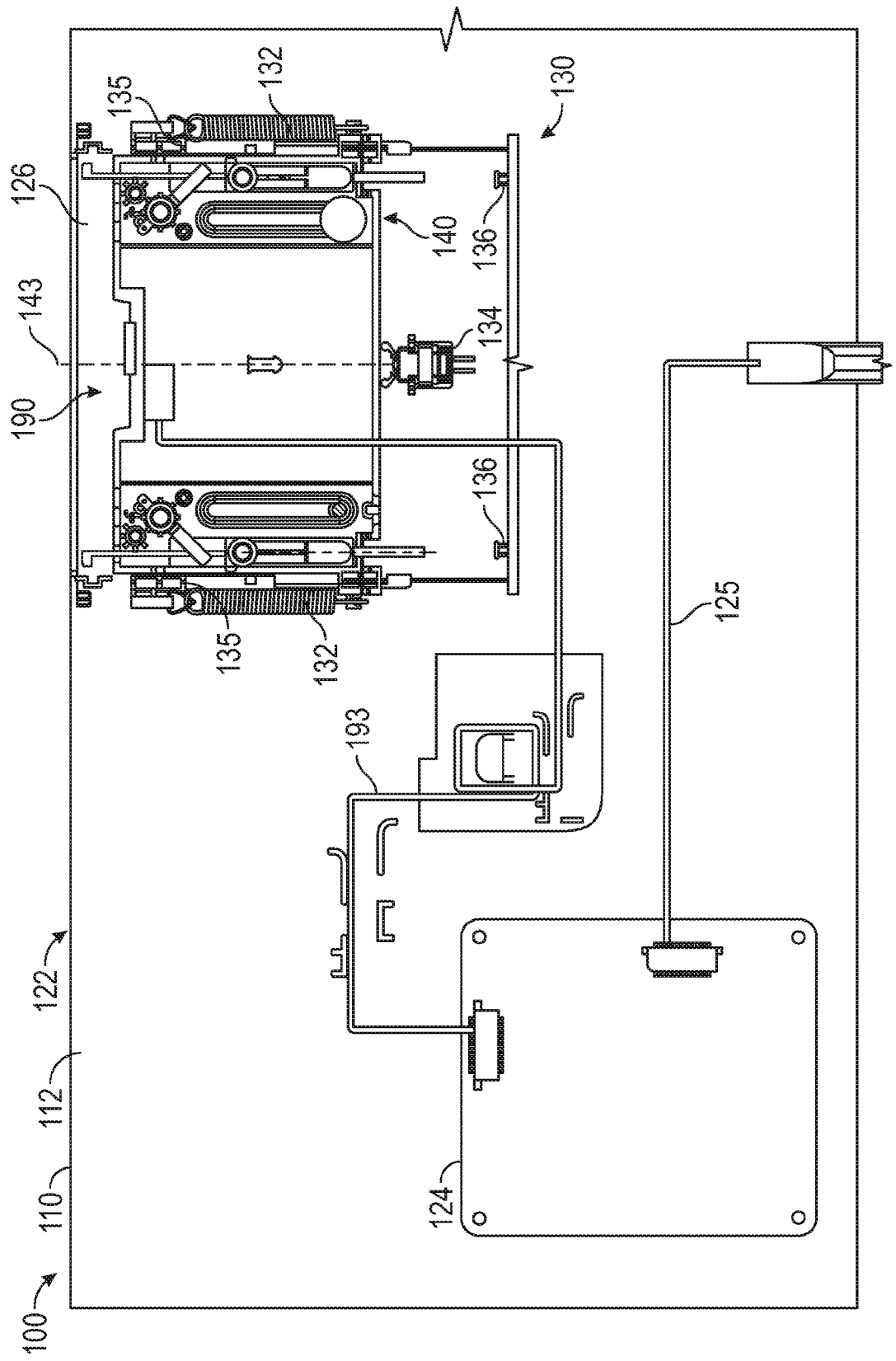
FIG. 2 shows an inside, partially schematic rear view of the electronic display device of FIG. 1, showing a mounting assembly for a peripheral module, in accordance with various examples.

FIG. 2 shows an inside view of display unit 110 with a back cover plate removed and with camera module 120 removed. In this example, within housing 112, display unit 110 includes an electric connector or image circuit 124, a recess 126 extending from top surface 122, a mounting apparatus 130 disposed within or adjacent recess 126, and a mounting assembly 140 moveably coupled to housing 112 by apparatus 130. Mounting assembly 140 is to couple a peripheral module to housing 112 physically and electrically and may also be called a peripheral mounting assembly.

Image circuit 124 may be a connection board or image processor such as a scalar printed circuit assembly electrically coupled to the mounting assembly 140 with a cable 193 and coupled to the display screen 114 via a cable 125. The image processor may include machine readable instructions that, when executed, cause the image processor to receive a first set of data from a camera module that is electrically coupled to mounting assembly 140. The image processor may include machine readable instructions that, when executed, cause the image processor to send a second set of data to the display screen, wherein the second set of data is based on the first set of data.

In FIG. 2, mounting apparatus 130 is disposed inside housing 112 and includes a pair of resilient members or springs 132, a catch mechanism 134, a pair of shoulders 135, and a pair of stop plates or stops 136. Shoulders 135 are disposed on the lateral sides of recess 126 and mounting apparatus 130. In general, catch mechanism 134 is a press-and-grasp-press-and-release style device. Springs 132 bias the mounting assembly 140 towards top surface 122 generally away from catch mechanism 134. FIG. 2 shows the position of mounting assembly 140 when not held by catch mechanism 134. Thus, the position shown in FIG. 2 represents the extended or outward position of mounting assembly 140 with respect to housing 112. The biasing force of springs 132 may pull assembly 140 toward the extended position. In this example, the entirety of assembly 140 is contained inside housing 112 or recess 126 with no portion of assembly 140 extending beyond outer surface 122 when mounting assembly 140 is in the extended position. Stops 136 are spaced from top surface 122 sufficiently that mounting assembly 140 may be disposed between outer surface 122 and stops 136 for all positions of assembly 140. In this example, mounting assembly 140 and mounting apparatus 130 form a combined assembly that may be installed or removed from within housing 112 as a combined unit, which may involve removing a rear cover of housing 112 in some examples.

Figure 3:
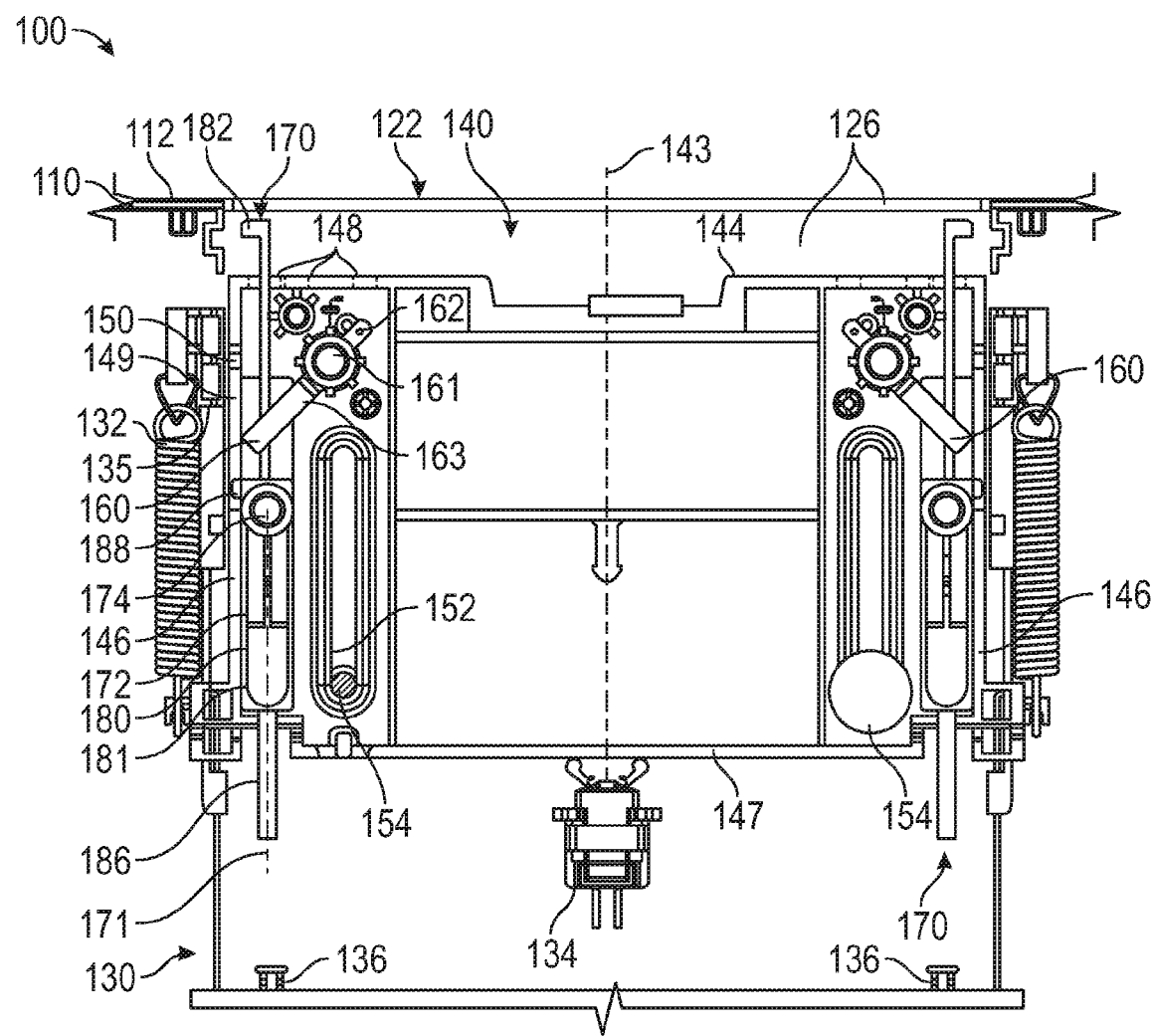
FIG. 3 shows an enlarged view of the electronic device and a camera mounting apparatus of FIG. 2 in accordance with various examples.

FIG. 3 shows a closer view of an example mounting assembly 140 installed within recess 126 of housing 112 and with assembly 140 in the extended position. In FIG. 3, mounting assembly 140 includes a body 142, a body axis 143 generally passing through a mid-plane of body 142, a pair of rotatable arms 160, a pair of latch mechanisms 170, and an electrical interconnect 190 having a cable 193 extending from image circuit 124. Latch mechanisms 170 releasably attach a camera module, such as camera module 120 (FIG. 1), to mounting assembly 140.

In this example, body 142 includes a top side 144, lateral sides 146, a bottom 147, a plurality of through-apertures 148 extending through top side 144 parallel to body axis 143, and a slot 149 in each lateral side 146. A body shoulder 150 is provided along each slot 149 proximal top side 144 and extends toward the body axis 143. In addition, body 142 includes a pair of elongate mounting slots 152 extending parallel to the body axis 143. A pin 154 extends through each slot 152. Pins 154 are fixably coupled to mounting apparatus 130 or housing 112. Body 142 is slidably coupled to housing 112 by pins 154 of mounting apparatus 130.

Each rotatable arm 160 is an elongate member having a rotational axis 161 perpendicular thereto, a first end 162, and a second end 163 opposite first end 162. Axis 161 is disposed between ends 162, 163, but proximal first end 162. Arm 160 is biased to the angular position shown in FIG. 3 with arm 160 oriented at an acute angle with respect to body axis 143 and the outer sides of body 142. In general, arm 160 may biased by a torsional spring (not shown), a linear spring, or other resilient members, as examples. In the angular position shown in FIG. 3, which may be called a first or biased angular position, end 163 of arm 160 is laterally spaced from shoulder 135. In some examples, such as the one shown, when arm 160 is in the biased angular position, end 163 is aligned completely over or positioned fully within body 142 and does not extend through a lateral side 146 beyond body 142. In the biased angular position, the angle of arm 160 with respect to axis 143 may be, for example, 45 degrees or may be between 40 and 50 degrees or between 30 and 70 degrees in various other examples.

For a range of angular positions of arm 160, including the biased angular position, end 162 is laterally aligned with an aperture 148 in top side 144. First end 162 functions as a contact location for arm 160 such that a component on a camera module (e.g., camera module 120) extending though aperture 148 may press downward (in the orientation of FIG. 3) on end 162 and cause arm 160 to rotate from the biased angular position to a second angular position, thereby moving end 162 upward.

Referring still to FIG. 3, each latch mechanism 170 includes an elongate latch member 172 extending along a latch axis 171 oriented parallel to body axis 143. Latch mechanism 170 is moveably coupled to the camera mounting body 142.

Referring now to FIG. 4, latch member 172 includes a slotted portion 180 including an elongate slot 181 extending along axis 171, an arm 182 extending from slotted portion 180, and a leg 186 extending from slotted portion 180. Arm 182 extends axially (relative to axis 171) from slotted portion 180, and leg 186 extends axially in the opposite direction from slotted portion 180. A boss 188 extends from slotted portion 180 in a direction that is substantially perpendicular to both axis 141 and lip 184.

As shown in FIG. 3, a pin or shoulder screw 174 extends from the camera mounting body 142 into slot 181. In this example, pin 174 is fixably attached to body 142. Pin 174 includes an enlarged head to retain latch member 172. Slotted portion 180 is disposed within or alongside camera mounting body 142, and arm 182 extends along the direction of axis 171 from camera mounting body 142 beyond top side 144. Thus, latch mechanism 170 is slidably coupled to the camera mounting body 142 by pin 174. In FIG. 3 mounting assembly 140 and latch mechanisms 170 182 are in a retracted position with no camera module attached. Arm 182 may be retained inside recess 126.

As shown in FIG. 3, stops 136 of mounting apparatus 130 are aligned with legs 186 of latch mechanism 170 to limit the axial movement (relative to axis 171) of latch member 172 into housing 112. For example, if mounting assembly 140 moves sufficiently downward, then legs 186 may press against stops 136, thereby limiting the downward movement of arms 182, which may aid the installation of a camera module 120 by encouraging arms 182 to enter the camera module grasp the module.

FIG. 5 shows an example of a camera module 120A that is illustrative of camera module 120 of FIG. 1 and may be installed in device 100. In FIG. 5, camera module 120A includes a central axis 201, a camera housing 202, a cover plate 204 closing camera housing 202, a first camera 205A mounted inside housing 202, a second camera 205B mounted inside housing 202, and a pair of microphones or sensing elements 235. In this example, camera 205B is spaced-apart from camera 205A along axis 201. Camera module 120A also includes a mounting end 222, a distal end 223, lateral sides 224, a pair of screw tabs 225 extending axially outward from mounting end 222, and a pair of second apertures 228, extending through mounting end 222 to receive an arm 182 of a latch mechanism 170 (FIG. 4).

Microphones 235 are located on distal end 223 and may be recessed within or protrude beyond distal end 223. In this location, the microphones can face outward even when the camera module is retracted into a housing such as housing 112 (e.g., FIG. 2). The placement may allow machine readable instructions, e.g., software, to activate a voice call or a "digital assistant" like "Siri," "Alexa," "Cortana," and the like while the camera is recessed. The digital assistant may be operated with privacy from a webcam, i.e., when only the microphones are active and the camera is not. In other instances, the digital assistant may be activated while the camera is mounted within and extended beyond the housing. The outward placement of microphones 235 may allow them to receive sound from multiple or all sides of the camera module, possibly collecting sound from a range that spans more than 180 degrees or spans up to or including 360 degrees. Some other embodiments of camera modules may have microphones 235 located on a side that includes a camera sensor 206 or on another location. More or less than the pair of microphones 235 can be included in the camera module, at various locations on the camera module. The microphones 235 can be other types of sensing elements, such as optical or light sensors.

In camera module 120A, first camera 205A includes a pair of camera sensors 206 pointed in a first direction (e.g., into the page of FIG. 5) through housing 202, and second camera 205B includes a camera sensor 206 pointed in a second direction through cover plate 204 and opposite the first direction. Any of camera sensors 206 may be selected from a group that includes sensor types such as: RGB sensors, RGB high definition sensors, infrared (IR) sensors, and other suitable image sensors. The sensors 206 of module 120A may be of the same type or of different types. Camera 205A and, more specifically, the center of one or both of its camera sensors 206 are disposed at a camera distance 208A from mounting end 222. Camera 205B and, more specifically, the center of its camera sensor 206 are disposed at a camera distance 208B from mounting end 222. Camera distance 208B is less than camera distance 208A. In some examples, the orientation of cameras 205A, 205B, or the direction their sensors are pointing in module 120A, are adjusted. In some examples, the placement of cameras 205A, 205B, e.g., which is closer to mounting end 222, may be adjusted.

Figure 6:
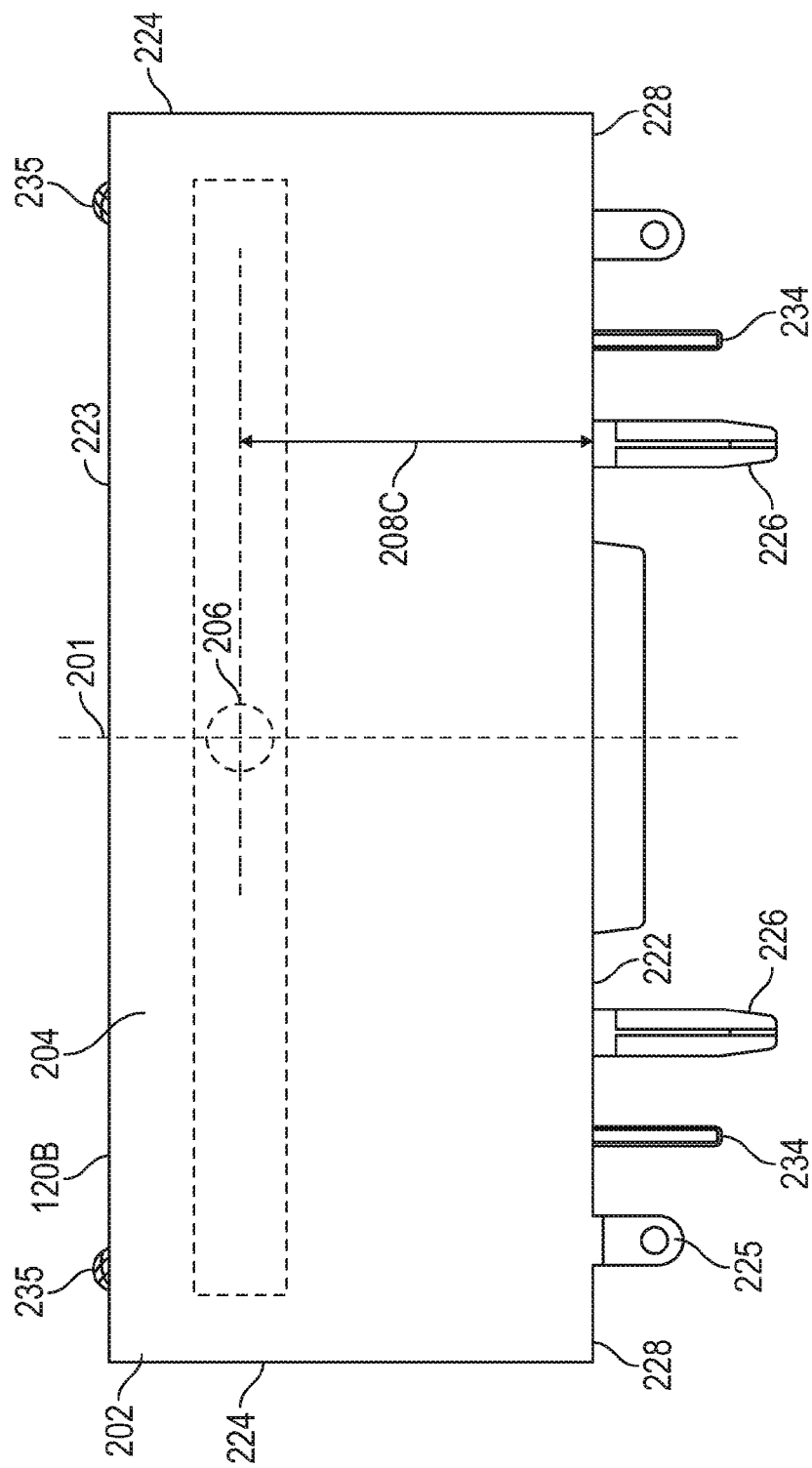
FIG. 6 shows a rear view of another camera module for removably attaching to the camera mounting apparatus of FIG. 3 in accordance with various examples.

FIG. 6 shows an example of a camera module 120B that is illustrative of camera module 120 of FIG. 1 and may be installed in device 100. Camera module 120B is similar or identical to module 120A with the exceptions that camera module 120B has one camera 205C instead of two cameras and camera module 120B includes probes 234, described below. For example, camera module 120B includes a central axis 201, a camera housing 202, a cover plate 204, a camera 205C mounted inside housing 202 and cover plate 204, and a pair of microphones 235, each numbered item as previously described. Camera module 120B also includes a mounting end 222, a distal end 223, lateral sides 224, a pair of screw tabs 225 extending outward from mounting end 222, a pair of alignment pins 226 extending outward from mounting end 222, a pair of apertures 228, as previously described with respect to module 120A. Microphones 235 are located on distal end 223 and may be recessed within or protrude beyond distal end 223. Unlike module 120A, module 120B includes a pair of pins or probes 234 extending outward from mounting end 222 with each probe 234 being disposed between a tab 225 and an alignment pin 226. Probes 234 are to engage rotatable arm 160 (FIG. 3) when module 120B is attached to mounting assembly 140.

In camera module 120B, camera 205C includes a camera sensor 206 pointed in a first camera direction (e.g., into the page of FIG. 6) through housing 202. Camera 205C and, more specifically, the center of camera sensor 206 are disposed at a camera distance 208C from mounting end 222. In various examples, camera distance 208C is equal to, less than, or greater than the camera distance 208A of camera module 120A. The sensor 206 of module 120A may be selected from any of the type of sensors mentioned above. In some examples of module 120B, camera 205C is replaced by another camera, such as a camera 205A, 205B. Although the camera modules 120A, 120B have one and two cameras, respectively, in other examples, a camera module compatible with electronic device 100 may have any feasible number of cameras, and further, each camera may have any feasible number of camera sensors.

Figure 7:
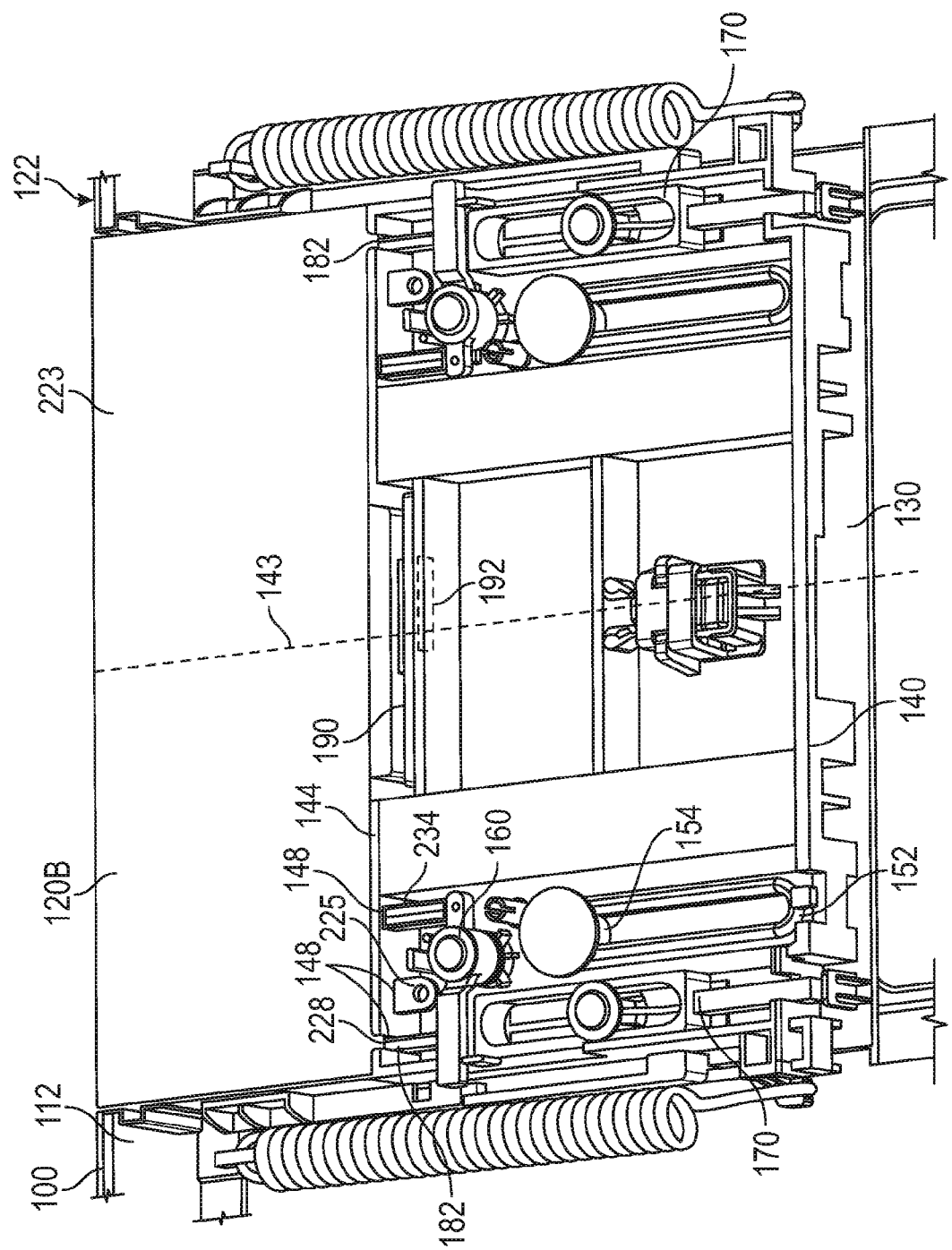
FIG. 7 shows an opened and enlarged perspective view of the electronic display device of FIG. 1 having the camera module of FIG. 6 installed therein, with the camera module in a recessed position in accordance with various examples.
Figure 8:
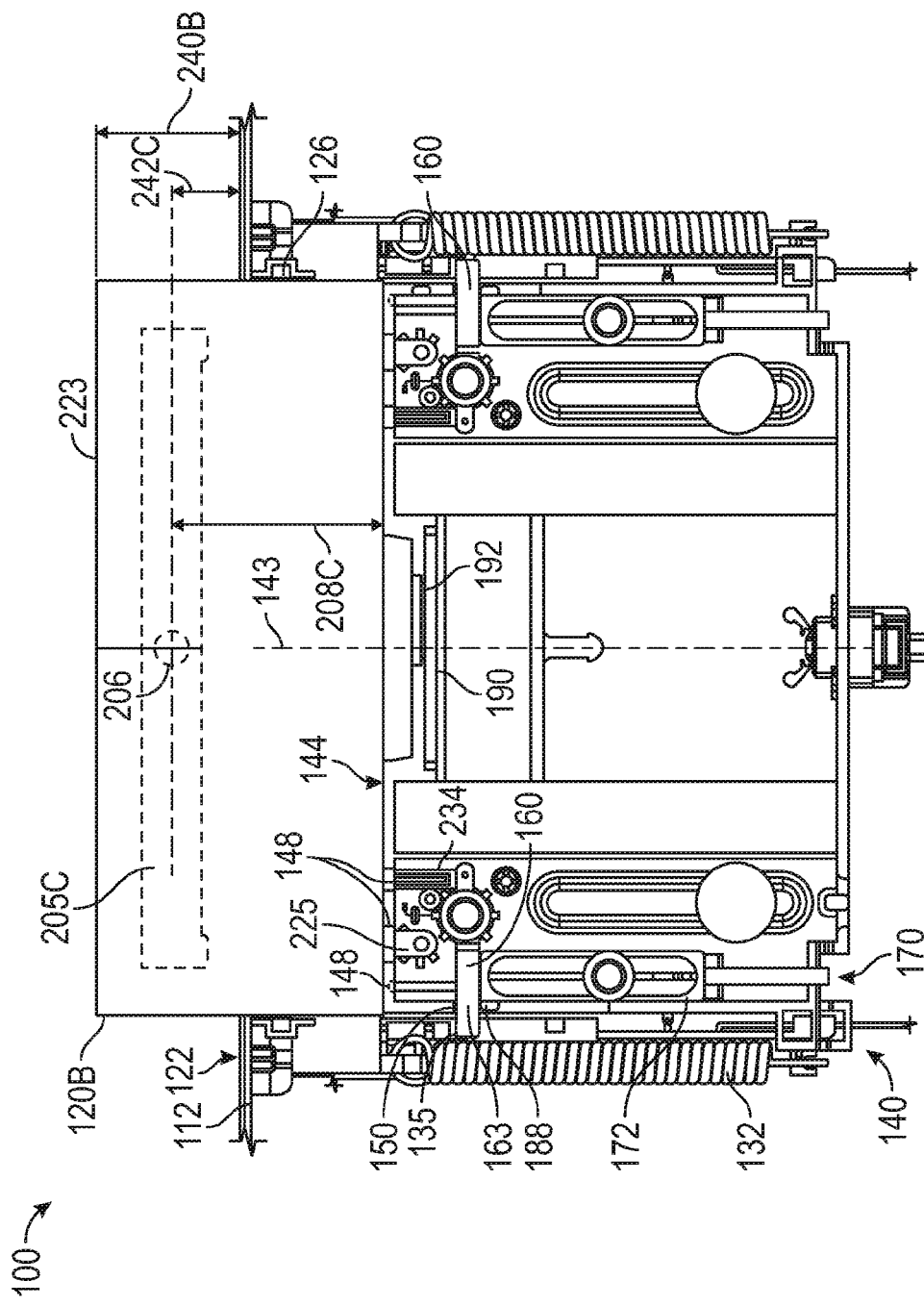
FIG. 8 shows a rear view of the electronic display device and camera module of FIG. 7, with the camera module moved to an operational position in accordance with various examples.

FIG. 7 and FIG. 8 show camera module 120B installed in electronic device 100 with module 120B coupled to mounting assembly 140 to move with assembly 140 along body axis 143. In FIG. 7, assembly 140 and module 120B are in a recessed position with module 120B entirely or almost fully received within recess 126 of housing 112. In FIG. 8, assembly 140 and module 120B are in a second outward position. When mounted to assembly 140 as shown in these two figures, camera module 120B may move into and out of recess 126 of housing 112 (FIGS. 2 and 3). This mounted configuration may be achieved by inserting module 120B into recess 126 and by pushing module 120B toward top side 144. Latch arms 182 extend through apertures 228 and grasp module 120B, attaching module 120B to assembly 140 and device 100. Mounting end 222 rests alongside, possibly contacting, first side 144 and distal end 223 is separated from first side 144 along axis 143. Tabs 225, alignment pins 226 (not shown), and probes 234 extend through various apertures 148 in mounting assembly 140, and module 120B is removably connected to electrical interconnect 190. Probes 234 have engaged and rotated rotatable arms 160, each to a second angular position, perpendicular or substantially perpendicular to axis 143. Each rotatable arm 160 has rotated such that end portion 163 extends alongside or between body shoulder 150 of mounting body 142 and boss 188 of latch mechanism 170. Rotatable arm 160 may contact one or both of body shoulder 150 and boss 188 in various circumstances. Boss 188 may be brought into this position relative too mounting assembly 140 and rotatable arm 160 by the installation of camera module 120B, during which latch mechanism 170 may rest against stop 136 while module 120B and mounting assembly 140 continue to move toward stop 136. Arms 182 may grasp camera module 120B to keep boss 188 adjacent rotatable arm 160 after installation.

Referring still to FIG. 8, to decouple or remove camera module 120B from mounting assembly 140 or device 100, arms 182 may be caused to disengage from module 120B. Other camera modules 120, e.g., module 120A, may be coupled to and decoupled from assembly 140 in the same manner as module 120B. As will be discussed in more detail below, if a module 120A is installed, rotatable arm 160 may remain in its biased angular position, allowing module 120A to move further beyond outer surface 122 than is achieved by module 120B in FIG. 8.

In FIG. 7, assembly 140 and module 120B are in a recessed position with module 120B entirely or almost fully received within recess 126 of housing 112. Distal end 223 of module 120B may be flush or recessed with respect to top surface 122 of housing 112. In some recessed positions, distal end 223 may extend slightly beyond top surface 122 of housing 112. Assembly 140 may be near its fully retracted position, with the top of slots 152 almost contacting pins 154.

In FIG. 8, assembly 140 and module 120B are in a second outward position in which assembly 140 is not as close to outer surface 112 as it was in the first outward position of FIG. 2 and FIG. 3. The location of this second outward position is influenced by rotatable arms 160 being in their second angular positions (for example, being perpendicular to axis 143) and engaging the shoulders 135 of mounting apparatus 130, which limits the outward movement of assembly 140 and module 120B. The force of springs 132 may work to bring assembly 140 to the second outward position of FIG. 8, contacting shoulders 135. Contact between rotatable arms 160 and bosses 188 may bear all or a portion of that spring force as it is transferred from mounting body 142, through arms 160, and to shoulders 135, potentially relieving the amount of that force that may be transferred through the rotational coupling that exists between body 142 and arms 160. In the second outward position, a portion of module 120B, including sensor 206 (not shown here) of camera 205C, is outside recess 126. Accordingly, FIG. 8 represents an operation position of module 120B because camera 205C is in a location where it can be used to take images of objects located outside housing 112. The distal end 223 of module 120B is disposed at a module clearance distance 240B beyond outer surface 122 and recess 126. Camera 205C and, more specifically, the center of camera sensor 206 are disposed at a lesser camera clearance distance 242C beyond outer surface 122 and recess 126. Camera distance 208C, introduced earlier, measures the distance of sensor 206 from first side 144 of mounting assembly 140.

Figure 9:
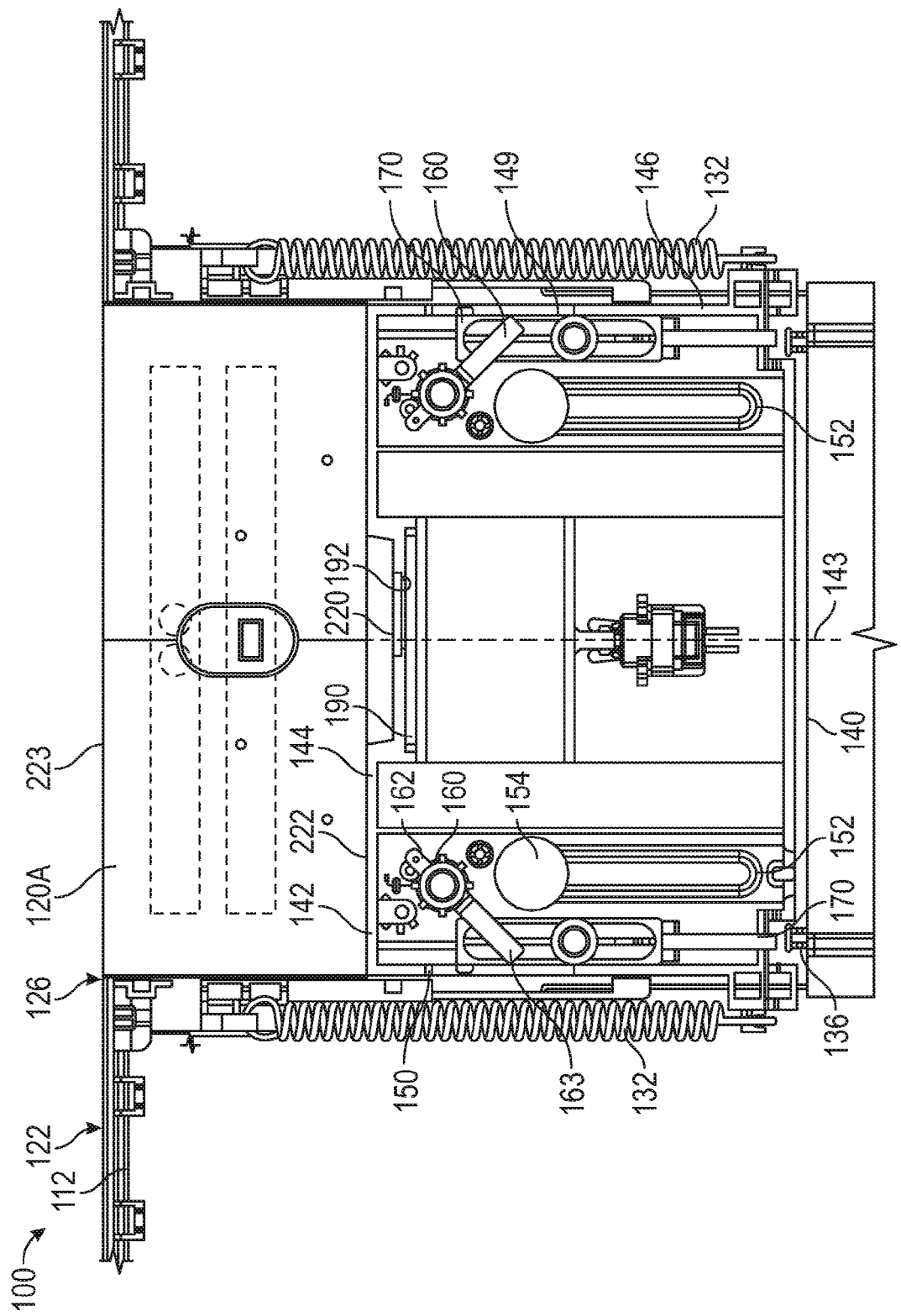
FIG. 9 shows an opened and enlarged rear view of the electronic display device of FIG. 1 having the camera module of FIG. 5 installed therein, with the camera module in a recessed position in accordance with various examples.
Figure 10:
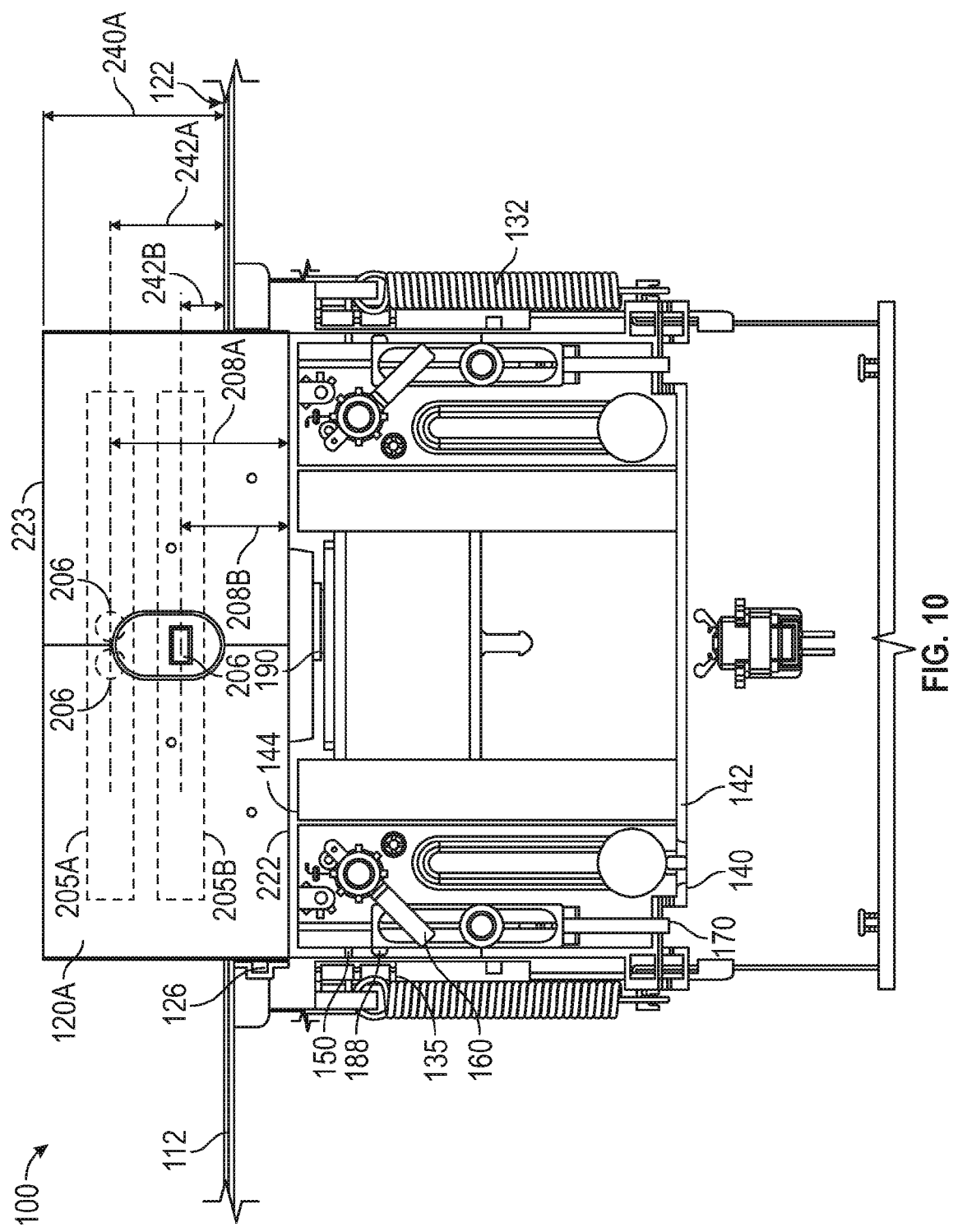
FIG. 10 shows a rear view of the electronic display device and camera module of FIG. 9, with the camera module moved to an operational position in accordance with various examples.

Referring now to FIG. 9 and FIG. 10, camera module 120A is shown installed in electronic device 100, coupled to mounting assembly 140 to move with assembly 140 along body axis 143. Mounted to assembly 140 as shown, camera module 120A may move into and out of recess 126 of housing 112. This mounted configuration may be achieved in the same or similar manner as was describe for camera module 120B, above. For example, module 120A may be inserted into recess 126 and pushed toward first side 144 so that arms 182 engage within module 120A, attaching module 120A to assembly 140 and device 100 (FIG. 5 and FIG. 7). Mounting end 222 rests alongside, and in some cases is contacting, first side 144 and distal end 223 is separated from first side 144 along axis 143. The connections between module 120A and mounting assembly 140 may be the same as described for module 120B, except module 120A lacks probes 234. Accordingly, no probes 234 extend into mounting assembly 140 to engage the ends 162 of rotatable arms 160. Thus, the pair of rotatable arms 160 may remain in their biased angular position as shown, or even if positioned differently after module 120A is installed, arms 160 have not rotated sufficiently to extend beyond slots 149 in lateral sides 146 and to forcibly engage shoulders 135. An example of the lack of engagement between arms 160 and shoulders 135 is shown in FIG. 10 in which mounting assembly 140 and module 120A are moved outward with respect to housing 112 while rotatable arms 160 are in their biased angular positions. End portions 163 of rotatable arms 160 do not extend alongside or between both body shoulder 150 of mounting body 142 and boss 188 of latch mechanism 170. As mentioned above, camera module 120A may be decoupled or removed from mounting assembly 140 or device 100 using the same or a similar technique as described for module 120B.

In FIG. 9, assembly 140 and module 120A are in a recessed position with module 120A entirely or almost fully received within recess 126 of housing 112. Distal end 223 of module 120A may be flush or recessed with respect to outer surface 122 of housing 112. In some recessed positions, distal end 223 may extend slightly beyond outer surface 122 of housing 112. Assembly 140 may be fully retracted with the top of slots 152 having contacted pins 154.

When assembly 140 and module 120A of FIG. 9 are depressed inward, catch mechanism 134 releases so that springs 132 may pull assembly 140 and module 120A to an outward position. In FIG. 10, assembly 140 and module 120A are in the first outward position in which assembly 140 may be at the same distance from outer surface 112 as it was in FIG. 2 and FIG. 3. The arrangement of FIG. 10 is achieved, in part, due to the position of rotatable arms 160, as described above. A portion of module 120A, including sensor 206 (not shown here) of camera 205A, is outside recess 126; consequently, FIG. 10 represents an operation position of module 120A because camera 205A is in a location where it can be used to take images of objects located outside housing 112. The distal end 223 of module 120A is disposed at a module clearance distance 240A beyond outer surface 122 and recess 126. Camera 205A and, more specifically, the center of camera sensors 206 are disposed at a lesser camera clearance distance 242A beyond outer surface 122 and recess 126. Camera distance 208A measures the distance of sensors 206 in camera 205A from first side 144 of mounting assembly 140. Also in FIG. 10, camera 205B and, more specifically, the center of its camera sensor 206 are disposed at a camera clearance distance 242B beyond outer surface 122 and recess 126. Camera distance 208B measures the distance of sensor 206 in camera 205B from first side 144 of assembly 140.

Comparing camera module 120B of FIG. 8 with camera module 120A of FIG. 10, module clearance distance 240B is less than module clearance distance 240A, and camera clearance distance 242C is less than camera clearance distance 242A. Thus for these examples, whether comparing the bodies of modules 120A, 120B or their outermost cameras 205A, 205C, module 120B, which includes probes 234, protrudes a lesser distance beyond outer surface 122 and recess 126 of housing 112 than does module 120A, which lacks probes 234.

Although mounting assembly 140 with mounting apparatus 130 were shown as installed in a housing that supports a display screen within the housing, in some examples, an assembly 140 or apparatus 130 are installed in a housing that does not have a display screen. Other selections of cameras or camera features may be made for various embodiments of camera modules 120A, 120B. Although the camera modules disclosed herein were mounted to travel through recess 126 extending through top surface 122 of electronic device 100, in some examples, a camera module attached to a mounting assembly 140 is coupled to move through another surface (for example, a side surface) in an electronic device.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications. For example, although various examples of the electronic devices disclosed may be implemented as AiO computers or within AiO computers, the concepts described herein may also be applied to other electronic devices, such as other desktop computers, stand-alone monitors, and, portable computers (including "tablet" and "laptop" computers), as examples.

What is claimed is:

1. An electronic device comprising:
an outer housing;
a mounting assembly moveably coupled to the outer housing to mount a peripheral module, the mounting assembly including a rotatable arm biased to a first angular position; and
a first shoulder disposed within the outer housing,
wherein the rotatable arm is to remain in the first angular position when a first peripheral module is mounted, whereby the mounting assembly is moveable to extend the first peripheral module to a first clearance distance; and
wherein the rotatable arm is rotatable to a second angular position in response to mounting a second peripheral module, whereby the mounting assembly is moveable to engage the rotatable arm against the first shoulder and to extend the second peripheral module to a second clearance distance less than the first distance.

2. The electronic device of claim 1, further comprising a display screen supported by the outer housing.

3. The electronic device of claim 1, wherein the mounting assembly includes a body slidably coupled to the outer housing to move along a body axis with the peripheral module;
wherein the body includes a first side and an aperture extending parallel to the body axis and through the first side;
wherein the rotatable arm is an elongate member and includes a rotational axis perpendicular to the elongate member; and
wherein a contact location on the rotatable arm is aligned with the aperture for a probe on the second peripheral module to extend through the aperture, to push against the contact location, and to rotate the rotatable arm to the second angular position.

4. The electronic device of claim 3, wherein the body of the mounting assembly comprises an elongate slot extending parallel to the body axis; and
wherein a pin coupled to the outer housing extends through the slot.

5. The electronic device of claim 3, wherein the rotational axis is perpendicular to the body axis.

6. The electronic device of claim 3, wherein the mounting assembly includes a latch mechanism to attach the mounting assembly to the first or second peripheral module, the latch mechanism comprising:
a slotted portion;
an arm coupled to an end of the slotted portion to grasp the first or second peripheral module; and
a boss extending parallel to the rotational axis,
wherein the slotted portion includes an elongate slot oriented parallel to the body axis; and
wherein a pin extends from the body of the mounting assembly into the slot of the slotted portion.

7. The electronic device of claim 6, wherein the body of the mounting assembly includes a body shoulder extending toward the body axis;
wherein the rotatable arm does not extend between the boss and the body shoulder when the rotatable arm is at the first angular position; and
wherein the rotatable arm extends between the boss and the body shoulder when the rotatable arm is at the second angular position.

8. An electronic device comprising:
an outer housing;
a mounting assembly moveably coupled to the outer housing to move a peripheral module into and out of the outer housing, the mounting assembly including a rotatable arm biased to a first angular position; and
a first shoulder disposed within the outer housing,
wherein the rotatable arm is to remain in the first angular position when a first peripheral module is mounted to the mounting assembly, whereby the mounting assembly is moveable to dispose a distal end of the first peripheral module to a first clearance distance beyond the outer housing;
wherein the rotatable arm is rotatable to a second angular position in response to mounting a second peripheral module to the mounting assembly, whereby the mounting assembly is moveable to engage the rotatable arm against the first shoulder and to dispose a distal end of the second peripheral module to a second clearance distance beyond the outer housing; and
wherein the second clearance distance is less than the first clearance distance.

9. The electronic device of claim 8, wherein the mounting assembly includes a body slidably coupled to the outer housing to move along a body axis with the peripheral module;

wherein the body includes a first side and an aperture extending parallel to the body axis and through the first side;

wherein the rotatable arm is an elongate member and includes a rotational axis perpendicular to the elongate member; and wherein a contact location on the rotatable arm is aligned with the aperture for a probe on the second peripheral module to extend through the aperture, to push against the contact location, and to rotate the rotatable arm to the second angular position.

10. The electronic device of claim 8, wherein the mounting assembly includes a body slidably coupled to the outer housing to move along a body axis;

wherein the body of the mounting assembly includes a body shoulder extending toward the body axis;

wherein the rotatable arm does not extend alongside the body shoulder when the rotatable arm is at the first angular position; and wherein the rotatable arm extends alongside the body shoulder when the rotatable arm is at the second angular position.

11. An electronic device comprising:

an outer housing including a recess to receive a peripheral module;

a display screen supported by the outer housing;

a mounting assembly moveably coupled to the outer housing to move the peripheral module into and out of the recess, the mounting assembly including a rotatable arm biased to a first angular position; and a first shoulder disposed at a fixed position within the outer housing, wherein the rotatable arm remains in the first angular position when a first peripheral module is mounted to the mounting assembly, whereby the mounting assembly is moveable to a first position to extend the first peripheral module beyond the recess of the outer housing; and wherein the rotatable arm is rotatable to a second angular position in response to mounting a second peripheral module to the mounting assembly, whereby the mounting assembly is moveable to a second position to engage the rotatable arm against the first shoulder and to extend the second peripheral module beyond the recess of the outer housing.

12. The electronic device of claim 11, wherein the mounting assembly includes a body slidably coupled to the outer housing to move along a body axis, wherein the body includes a first side;

wherein the first peripheral module includes a mounting end to be disposed alongside the first side of the body and a distal end to be separated from the first side of the body; and wherein when the first peripheral module is mounted to the mounting assembly, and the mounting assembly is disposed at the first position, the distal end of the first peripheral module is disposed at a first clearance distance beyond the recess of the outer housing.

13. The electronic device of claim 12, wherein the second peripheral module includes a mounting end to be disposed alongside the first side of the body and a distal end to be separated from the first side of the body;

wherein when the second peripheral module is mounted to the mounting assembly, and the mounting assembly is disposed at the second position, the distal end of the second peripheral module is disposed at a second clearance distance beyond the recess of the outer housing; and wherein the second clearance distance is less than the first clearance distance.

14. The electronic device of claim 11, wherein the first peripheral module includes a mounting end to be disposed alongside a first side of the body, a first camera disposed at a first camera distance from the mounting end, and a second camera disposed at a second camera distance from the mounting end;

wherein the second camera distance is less than the first camera distance; and wherein when the first peripheral module is mounted to the mounting assembly and the mounting assembly disposed at the first position, the first camera is disposed at a first clearance distance beyond the recess of the outer housing.

15. The electronic device of claim 14 wherein the second peripheral module includes a mounting end to be disposed alongside the first side of the body and a camera disposed at a third camera distance from the mounting end;

wherein the third camera distance is equal to or greater than the first camera distance;

wherein when the second peripheral module is mounted to the mounting assembly, and the mounting assembly is disposed at the second position, the camera of the second peripheral module is disposed at a second clearance distance beyond the recess of the outer housing; and wherein the second clearance distance is less than the first clearance distance.

* * * * *